(12) United States Patent
Smoll et al.

(10) Patent No.: US 10,644,421 B2
(45) Date of Patent: May 5, 2020

(54) ELECTRICAL CONNECTOR WITH DIELECTRIC PROPERTIES SUITABLE FOR HIGH SPEED DATA TRANSMISSION

(71) Applicant: Aptiv Technologies Limited, St. Michael OT (BB)

(72) Inventors: Eric J. Smoll, Fontana, CA (US); Bao Q. Le, Santa Ana, CA (US); Joon Lee, Carmel, IN (US); Gerald A. Rhinehart, Jr., Lordstown, OH (US); Scott P. Cohen, Corona, CA (US)

(73) Assignee: Aptiv Technologies Limited (BB)

( * ) Notice: Subject to any disclaimer, the term of this patent is extended or adjusted under 35 U.S.C. 154(b) by 0 days.

(21) Appl. No.: 16/019,654

(22) Filed: Jun. 27, 2018

(65) Prior Publication Data

US 2020/0006878 A1    Jan. 2, 2020

(51) Int. Cl.
*H01R 13/648* (2006.01)
*H01R 12/73* (2011.01)
*H01R 12/70* (2011.01)
*H05K 1/14* (2006.01)

(52) U.S. Cl.
CPC ......... *H01R 12/737* (2013.01); *H01R 12/707* (2013.01); *H05K 1/14* (2013.01)

(58) Field of Classification Search
CPC ....... H01R 12/737; H01R 12/707; H05K 1/14
USPC ....... 439/271, 278, 281, 282, 732, 198, 941, 439/485
See application file for complete search history.

(56) References Cited

U.S. PATENT DOCUMENTS

| | | | | |
|---|---|---|---|---|
| 6,863,549 B2* | 3/2005 | Brunker | ............. | H01R 13/6477 439/108 |
| 6,899,550 B2* | 5/2005 | Perugini | ............... | H01R 13/187 174/255 |
| 6,953,351 B2* | 10/2005 | Fromm | ................ | H01R 13/514 439/101 |
| 6,969,268 B2* | 11/2005 | Brunker | ............... | H01R 23/688 439/108 |
| 7,645,146 B2* | 1/2010 | Lindkamp | ............ | H01R 12/721 439/79 |
| 2005/0159040 A1* | 7/2005 | Brunker | ............... | H01R 23/688 439/497 |
| 2010/0022129 A1* | 1/2010 | Morgan | ............. | H01R 13/6477 439/607.05 |
| 2012/0322278 A1* | 12/2012 | Nakamura | ............. | H01R 4/023 439/81 |
| 2016/0190747 A1* | 6/2016 | Regnier | ............... | H01R 9/2408 439/607.08 |

* cited by examiner

*Primary Examiner* — Abdullah A Riyami
*Assistant Examiner* — Nelson R. Burgos-Guntin
(74) *Attorney, Agent, or Firm* — Robert J. Myers

(57) ABSTRACT

An electrical connector assembly includes a connector body that is formed of a first dielectric material defining a terminal cavity configured to receive an electrical terminal. The connector body defines a chamber that is separate from the terminal cavity. The chamber contains a second dielectric material that has a lower dielectric constant property than the first dielectric material, such as air. The connector body may be formed by as additive manufacturing process, such as 3D printing, stereolithography, digital light processing, fused deposition modeling, fused filament fabrication, selective laser sintering, selecting heat sintering, multi-jet modeling, multi-jet fusion, electronic beam melting, and laminated object manufacturing.

17 Claims, 5 Drawing Sheets

ELECTRICAL CONNECTOR WITH DIELECTRIC PROPERTIES SUITABLE FOR HIGH SPEED DATA TRANSMISSION

TECHNICAL FIELD OF THE INVENTION

The invention generally relates to an electrical connector assembly.

BRIEF DESCRIPTION OF THE SEVERAL VIEWS OF THE DRAWING

The present invention will now be described, by way of example with reference to the accompanying drawings, in which.

Similar elements in the various embodiments presented share the last two digits of the reference number.

DETAILED DESCRIPTION OF THE INVENTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Currently, connector bodies used in electrical connectors for high frequency signals, e.g. those used for high speed data transmission, are machined or injected molded using a low dielectric/low dissipation factor plastic material to form the connector bodies. The terminal cavities within the connector bodies are accurately machined or molded via high pressure high temperature injection molding machine processes using ejector pins. The external features of the connector bodies are formed from the mold tooling e.g. hard tooling. These molding and/or machining processes cannot create captive features, sealed internal features, or "blind" features in the molded connector body. Typically captive features in molded plastic parts are considered voids and are rejected. The typical voids in plastic parts are random is size, shape and location and are thus considered defects.

The connector bodes of high speed electrical connectors typically have uniform low dielectric constant and dissipation factor properties. Additives introduced into the engineered plastic material forming the connector body, e.g. polyamide (PA or polybutylene terephthalate (PBT), to enhance the plastic physical properties, e.g. glass or ceramic fillers, are not uniformly distributed in the molded plastic and can degrade rather than enhance high speed performance of the connector assembly. Therefore, high speed connector designs have been restricted in plastic material choices to higher costs plastic material, e.g. amorphous fluoroplastics, that may have desirable dielectric characteristics but do to have optimal mechanical characteristics.

A proposed innovative solution to the plastic material limitations, and the associated design limitations with these plastic materials, can be provided by including cavities or voids filed with air or another dialectical material that are precisely sized and located within connector bodies that are formed of typical engineered plastics using additive manufacturing methods and practices.

Figure 1:
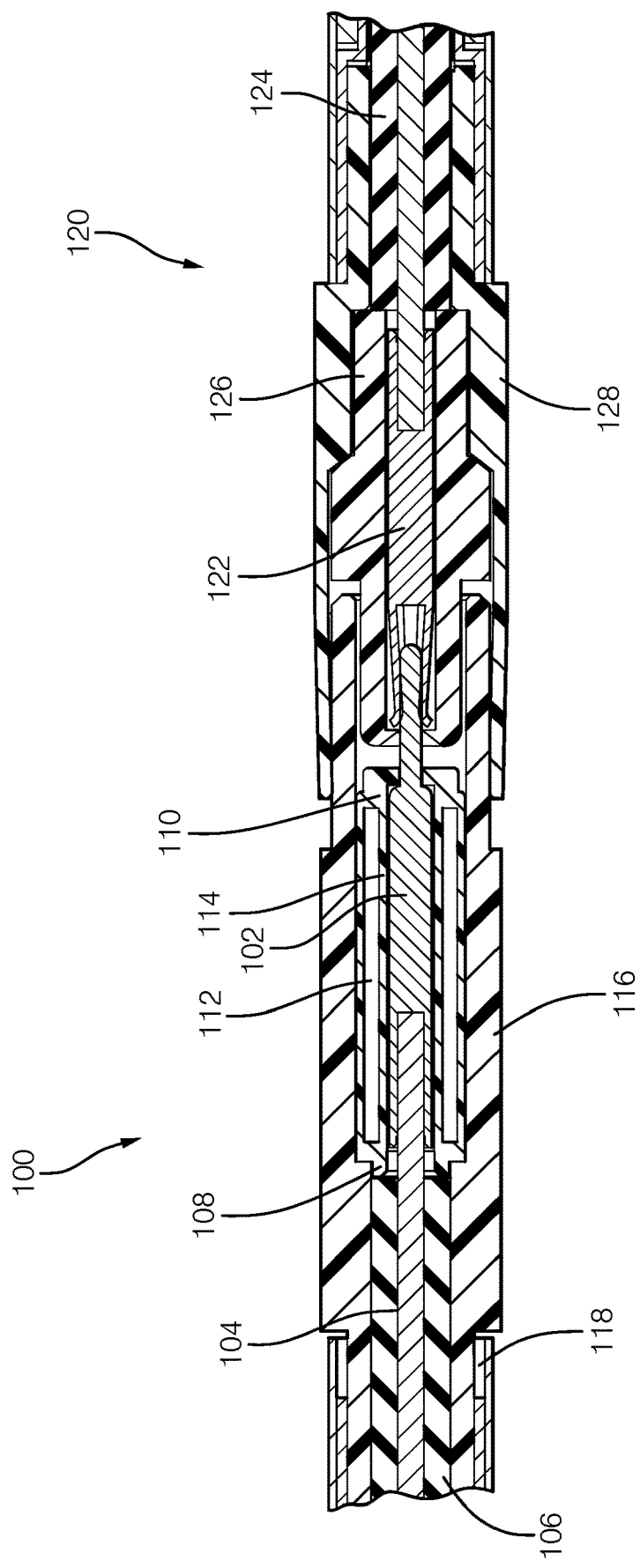
FIG. 1 is a cross section view of an electrical connector assembly, according to one embodiment.
Figure 2:
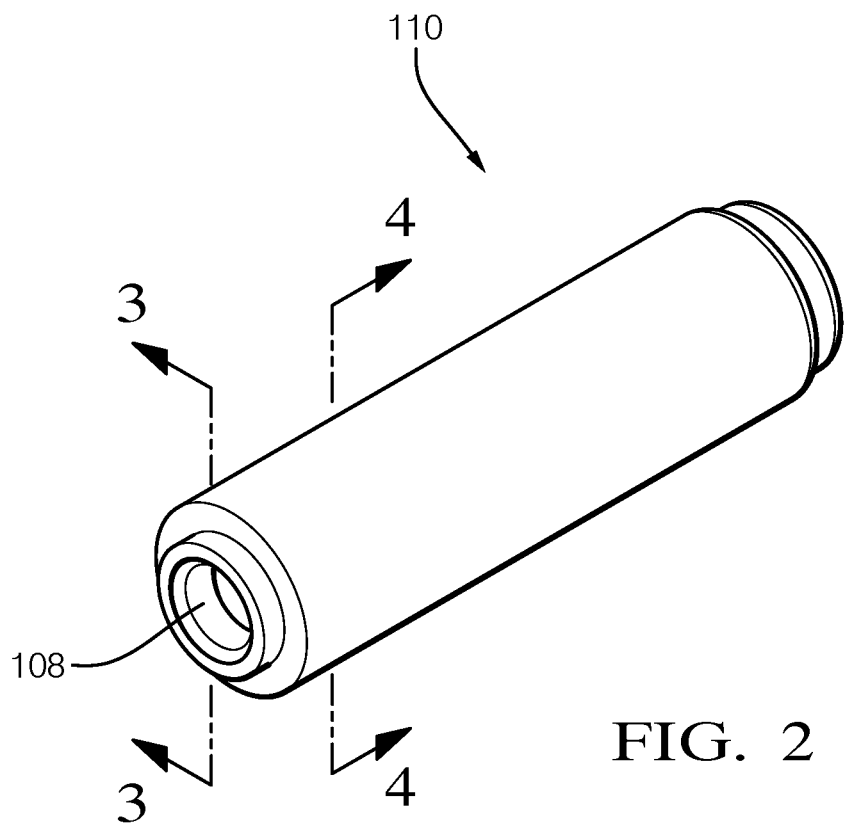
FIG. 2 is a perspective view of a connector body of the electrical connector assembly of FIG. 1, according to one embodiment.
Figure 3:
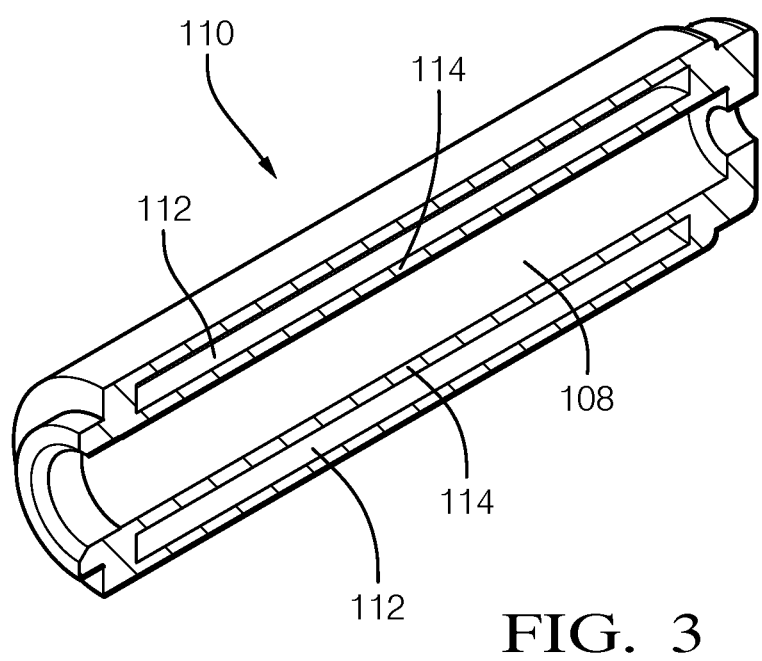
FIG. 3 is a perspective cross section view of the connector body of FIG. 2, according to one embodiment.

FIG. 1 illustrates a coaxial electrical connector assembly, hereinafter referred to as the assembly 100, according to an embodiment of this invention. The assembly 100 includes an electrically conductive plug type electrical terminal, hereinafter referred to as the terminal 102, attached to a center conductor 104 of a coaxial cable 106. The terminal 102 is received within a terminal cavity 108 of a connector body 110 formed of a first dielectric material, e.g. PA. As shown in FIGS. 1-3, the connector body 110 defines a chamber 112 that is separated from the terminal cavity 108 by a cavity wall 114. The chamber 112 contains a second dielectric material that has a lower dielectric constant than the first dialectical material forming the connector body 110. In this example, the chamber 112 has a cylindrical shape longitudinally surrounding the terminal cavity 108. The chamber 112 is a sealed cavity and is filled with air which has a dielectric constant of 1. As used herein, air is a gaseous material comprising 78%±4% nitrogen by volume and 21%±0.5% oxygen by volume. Alternative embodiments of the invention may be envisioned in which the second dielectric material is another gaseous, liquid, or solid material which has a lower dielectric constant than the first dielectric material forming the connector body 110. The shape and the location of the chamber 112 and the second dielectric material within the connector body 110 are selected to modify dielectric properties of the connector body 110 to provide a desired dielectric constant for the connector body 110.

The sealed chamber 112 may be formed within the connector body 110 by using an automated additive manufacturing process, such as 3D printing, stereolithography, digital light processing, fused deposition modeling, fused filament fabrication, selective laser sintering, selecting heat sintering, multi-jet modeling, multi-jet fusion, electronic beam melting, and laminated object manufacturing, to form the connector body 110. The sealed chamber 112 can be economically formed because the automated additive manufacturing process does not require access paths for molding or machining tools.

The connector body 110 is disposed within a conductive shield 116 that is connected to the shielding conductor 118 of the coaxial cable 106. The assembly 100 is interconnected to a mating coaxial electrical connector assembly 120 having a mating socket terminal 122 connected to another coaxial cable 124 disposed within a mating connector body 126 surrounded by a mating shield 128. While the mating connector body 126 shown in FIG. 1 does not include a chamber, other embodiments of the mating connector body 126 may be envisioned that do include a chamber to optimize dielectric properties of the mating connector body 126.

Figure 4:
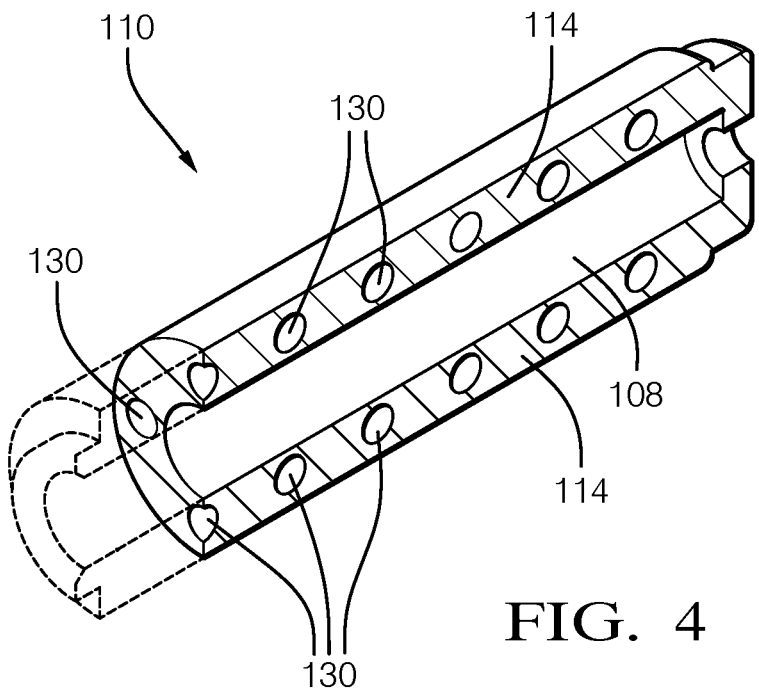
FIG. 4 is a perspective cross section view of the connector body of FIG. 2, according to another embodiment.

FIG. 4 illustrates an alternative embodiment of the connector body 110 that includes a plurality of chambers 130 in the form of sealed spheres formed in the connector body 110 arranged in an array to longitudinally surround the terminal cavity 108. These chambers 130 may be filed with air or another gaseous, liquid, or solid material which has a lower dielectric constant than the first dielectric material forming the connector body 110.

Figure 5:
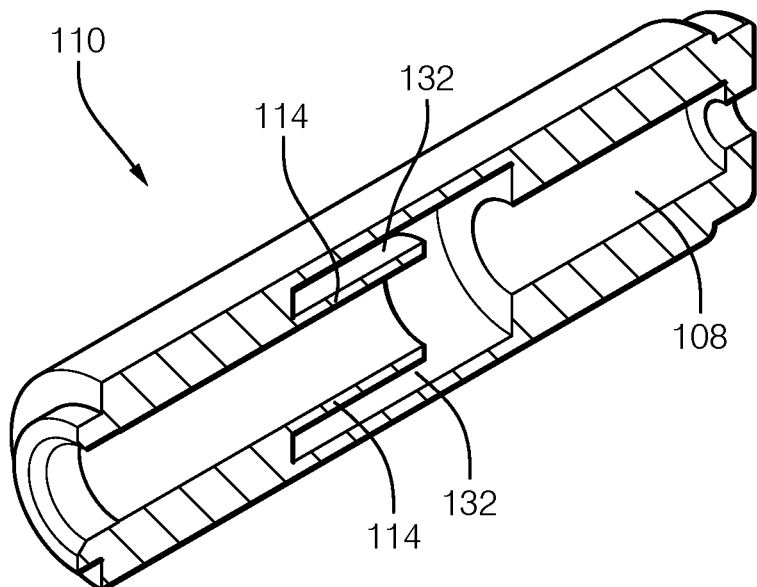
FIG. 5 is a perspective cross section view of the connector body of FIG. 2, according to yet another embodiment.

FIG. 5 illustrates yet another alternative embodiment of the connector body 110 that includes an unsealed cylindrical chamber 132 that is connected to the terminal cavity 108 by a passage through the cavity wall 114. This chamber 132 is filed with ambient air.

Figure 6:
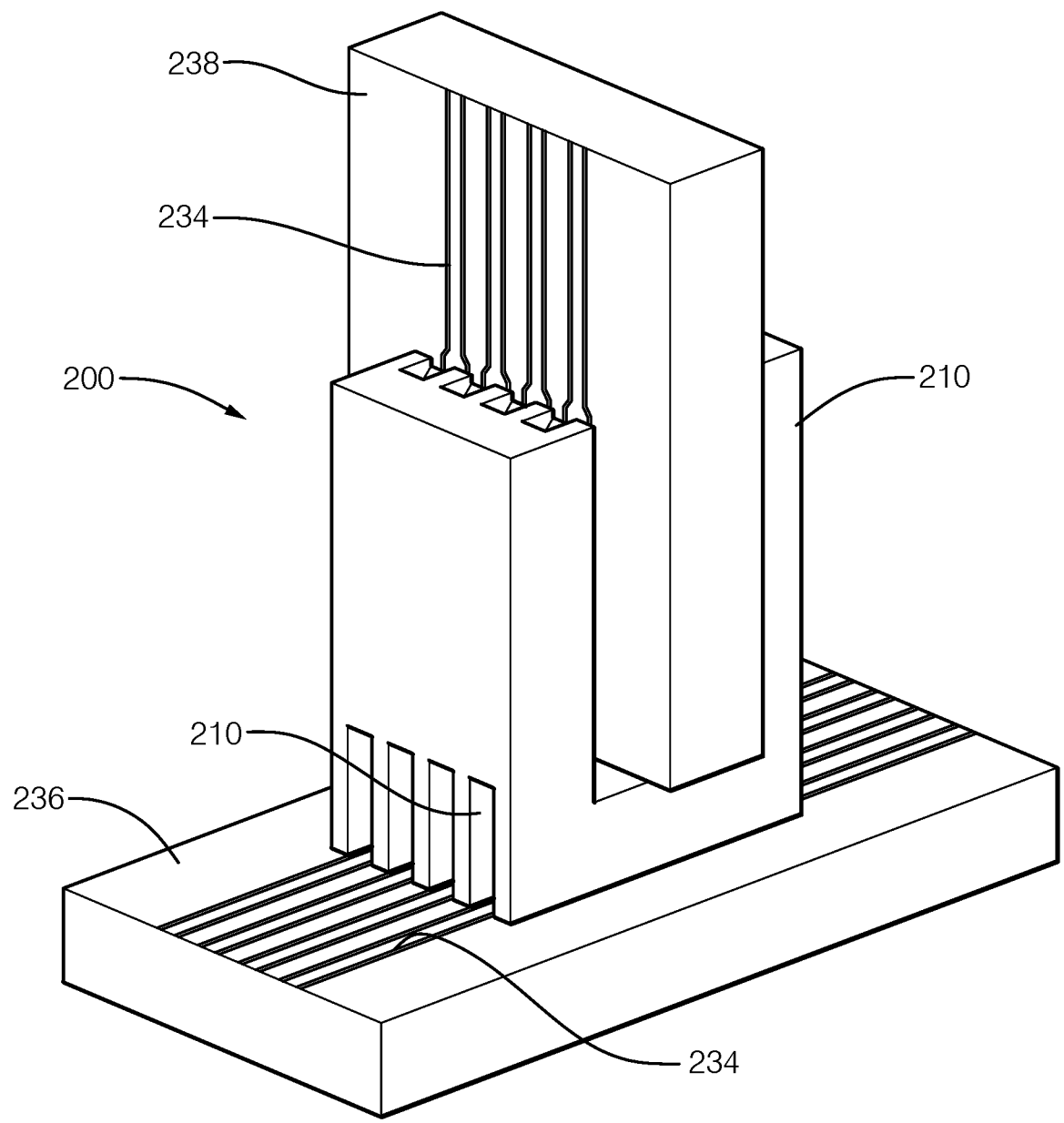
FIG. 6 is a perspective view of an electrical connector assembly, according to another embodiment.
Figure 7:
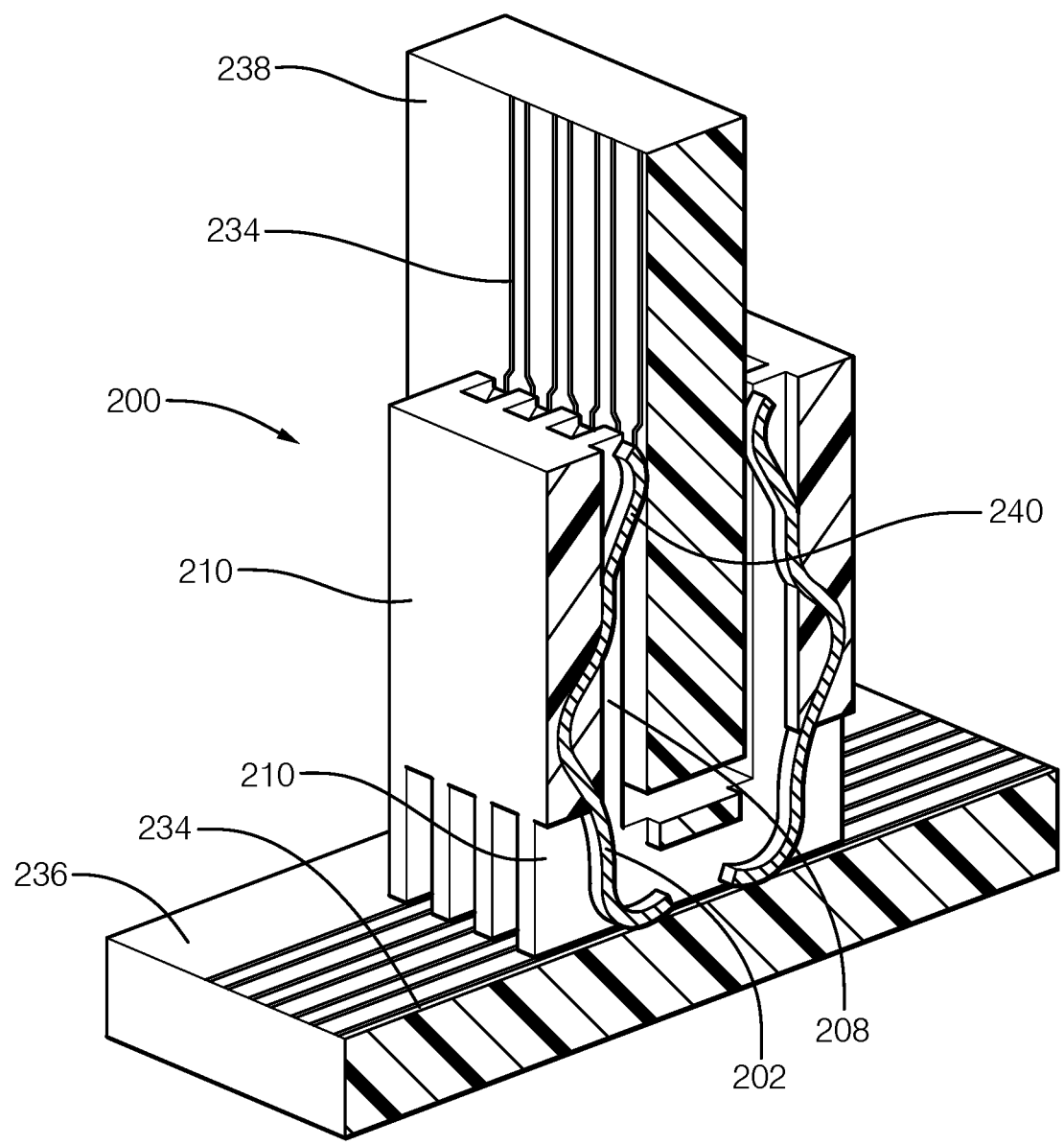
FIG. 7 is a cross section view of the electrical connector assembly of FIG. 6, according to the another embodiment.

FIG. 6 illustrates a board edge connector assembly, hereinafter referred to as the assembly 200, suited to interconnect circuit board traces 234 on two separate printed circuit boards (PCB) 236, 238. As shown in FIG. 7, the assembly 200 includes a terminal 202 disposed within a terminal cavity 208 of a connector body 210. One end of the terminal 202 is attached by soldering or a spring arm compressive contact to a conductive trace 234 on the first PCB 236 and the other end has a spring arm 240 that is in compressive contact with a conductive trace 234 on the second PCB 238. The connector body 210 defines a chamber 212 filled with ambient air that is connected to the terminal cavity 208. The shape and the location of the chamber 212 within the connector body 210 are selected to modify dielectric properties of the connector body 210 to provide a desired dielectric constant for the connector body 210.

Accordingly, an assembly 100, 200 having a connector body 110, 210 with a chamber 112, 212 configured to tune the dielectric properties of the assembly 100, 200 is provided. The chamber 112, 212 allows the use of lower cost plastic material to form the connector body 110, 210 while still providing dielectric properties that allow high frequency operation of the assembly 100, 200. Use of additive manufacturing processes to form the connector body provides the additional benefit of a sealed chamber that has more stable dielectric characteristics since the second dielectric material in the chamber cannot change due to atmospheric changes or introduction of environmental contaminants into the chamber.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments, and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

We claim:

1. An electrical connector, comprising:
   a connector body formed of a first dielectric material defining a terminal cavity configured to receive an electrical terminal, wherein the connector body defines a sealed chamber formed in a cavity wall adjacent the terminal cavity and separate from the terminal cavity, said sealed chamber containing a second dielectric material that has a lower dielectric constant property than the first dielectric material, wherein the sealed chamber defines a cylindrical shape and wherein the sealed chamber circumferentially and longitudinally surrounds the terminal cavity.

2. The electrical connector according to claim 1, wherein the first dielectric material is a polymer and the second dielectric material is a gaseous material.

3. The electrical connector according to claim 2, wherein the gaseous material is air comprising about 78% nitrogen by volume and about 21% oxygen by volume.

4. The electrical connector according to claim 1, wherein the connector body is formed by an automated additive manufacturing process.

5. The electrical connector according to claim 4, wherein a shape of the sealed chamber formed by the additive manufacturing process within the connector body modifies dielectric properties of the connector body to provide a desired dielectric constant of the connector body.

6. The electrical connector according to claim 4, wherein the automated additive manufacturing process is selected from a list consisting of 3D printing, stereolithography, digital light processing, fused deposition modeling, fused filament fabrication, selective laser sintering, selecting heat sintering, multi-jet modeling, multi-jet fusion, electronic beam melting, and laminated object manufacturing.

7. An electrical connector assembly, comprising:
the electrical connector according to claim 1; and
an electrical terminal disposed within the terminal cavity.

8. An electrical connector assembly, comprising:
the electrical connector according to claim 1, wherein the connector body defines a plurality of the terminal cavities and a plurality of the sealed chambers; and
a plurality of electrical terminal disposed within the plurality of the terminal cavities.

9. The electrical connector according to claim 1, wherein the sealed chamber is completely surrounded by the cavity wall.

10. The electrical connector according to claim 1, wherein the sealed chamber is enclosed within the cavity wall.

11. The electrical connector according to claim 1, wherein the sealed chamber is encased within the cavity wall.

12. The electrical connector according to claim 1, wherein the sealed chamber is configured to affect the dielectric properties of the connector body.

13. The electrical connector according to claim 1, wherein the sealed chamber is configured such that the second dielectric material in the chamber cannot change due to atmospheric changes or introduction of environmental contaminants into the chamber.

14. The electrical connector according to claim 1, wherein the sealed chamber is hermetically sealed.

15. The electrical connector according to claim 14, wherein a location of the hermetically sealed chamber within the connector body formed by the automated additive manufacturing process modifies dielectric properties of the connector body to provide a desired dielectric constant of the connector body.

16. The electrical connector according to claim 14, wherein the second dielectric material within the hermetically sealed chamber formed by the automated additive manufacturing process modifies dielectric properties of the connector body to provide a desired dielectric constant of the connector body.

17. An electrical connector, comprising:
a connector body formed of a first dielectric material defining a terminal cavity configured to receive an electrical terminal, wherein the connector body defines a sealed chamber formed in a cavity wall adjacent the terminal cavity and separate from the terminal cavity, said sealed chamber containing a second dielectric material that has a lower dielectric constant property than the first dielectric material, wherein the sealed chamber defines a spherical shape and wherein the connector body defines a plurality of sealed spherical chambers circumferentially and longitudinally surrounding the terminal cavity.

\* \* \* \* \*